(12) United States Patent
Ashikaga

(10) Patent No.: US 6,781,866 B2
(45) Date of Patent: Aug. 24, 2004

(54) SEMICONDUCTOR MEMORY AND WRITING METHOD AND READING METHOD FOR THE SAME

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/654,904

(22) Filed: Sep. 5, 2003

(65) Prior Publication Data

US 2004/0105295 A1 Jun. 3, 2004

(30) Foreign Application Priority Data

Sep. 9, 2002 (JP) .................................... 2002-262537

(51) Int. Cl.[7] .............................................. G11C 11/22
(52) U.S. Cl. ...................... 365/145; 365/149; 365/205
(58) Field of Search ................................ 365/145, 149, 365/205, 222, 117

(56) References Cited

U.S. PATENT DOCUMENTS 5,487,029 A * 1/1996 Kuroda ...................... 365/145
5,550,770 A * 8/1996 Kuroda ...................... 365/145
6,151,242 A * 11/2000 Takashima .................. 365/145

* cited by examiner

Primary Examiner—Gene N. Auduong
(74) Attorney, Agent, or Firm—Rabin & Berdo, P.C.

(57) ABSTRACT

A semiconductor memory includes bit lines, memory cells and a sense amplifier both of which are connected to the bit lines. Each of the memory cells includes a transistor and a capacitor. The capacitor is made of a material having a quantity of residual dielectric polarization in an electroless state in a hysteresis characteristic that is not reduced to less than a threshold value until after a lapse of a time of a refreshing cycle. The refresh cycle includes clock cycles. The sense amplifier detects an output current on the bit lines due to the residual dielectric polarization. The sense amplifier amplifies the output current to refresh the quantity of residual dielectric polarization of the capacitor when the detected level is equal to or larger than the threshold value. The sense amplifier does not amplify the output current when the detected level is less than the threshold value.

11 Claims, 8 Drawing Sheets

SEMICONDUCTOR MEMORY AND WRITING METHOD AND READING METHOD FOR THE SAME

BACKGROUND OF THE INVENTION

1. Field of the Invention

This invention relates to a semiconductor memory using a ferroelectric material having a hysteresis characteristic, and particularly to a semiconductor memory that performs refreshing by using a ferroelectric material having a relatively large reduction per hour in quantity of residual dielectric polarization in an electroless state.

2. Description of the Related Art

As recent semiconductor devices are expected be loaded on portable devices or mobile devices, lower-voltage operation and reduction in power consumption as well as reduction in size, weight and thickness are increasingly demanded of the semiconductor devices. It is known that forming a semiconductor device on an SOI (silicon-on-insulator) substrate can satisfy such demand and enables high-speed operation.

For example, by forming a device using perfect depletion-type SOI, it is possible to enable lower voltage/power saving and high-speed operation in comparison with a device on bulk Si. (For example, see Kouichi Yokomizo, "Application Field of FD-SOI Device," Lecture Articles of the 57th Integrated Circuit Symposium, 1999, pages 37–42.)

However, if a DRAM (dynamic random access memory), which is a semiconductor device and often used as a memory device of various equipment, is formed on a SOI substrate for the above-described purpose of lower voltage/power saving, a problem is found that a junction leakage current at a PN junction increases, compared with the case a DRAM is formed on the conventional bulk Si.

Generally, to hold data in a DRAM, a node between a capacitor electrode and a diffusion layer within the DRAM must be held at a potential that is not 0 V (or Vss: substrate potential). Therefore, the holding of data in the DRAM is determined by the magnitude of a junction leakage current from a PN junction. As the junction leakage current increases, the data holding time in the DRAM becomes shorter, and the cycle of refreshing the data held in the DRAM must be shortened. This is against power saving. Therefore, forming a DRAM on an SOI substrate while realizing power saving is a very difficult task.

To deal with this task, there is known an example of hybrid mounting of a DRAM and other devices on an SOI substrate by deleting a part of the SOI and forming the DRAM in that part, instead of simultaneously forming the DRAM and the other devices on the SOI substrate. (For example, see Toshiba Press Release on development of a DRAM cell hybrid mounting technique on an SOI wafer, Jun. 12, 2002, searched on the Internet on Jun. 28, 2002, at URL:http://www.toshiba.co.jp/about/press/2002_06/pr_j1201.htm.)

In consideration of the above-described reason for the difficulty in forming a DRAM on an SOI substrate while realizing power saving, for example, if the potential at a node between a capacitor electrode and a diffusion layer within the DRAM can be made 0 V (or Vss: substrate potential), the above-described problem can be solved, and lower voltage/power saving and high-speed operation are enabled in an SOI substrate on which a DRAM and other devices are mounted in a hybrid manner without deleting a part of the SOI. Conventionally, however, it is impossible to realize 0 V (or Vss: substrate potential) at a node between capacitor electrode and a diffusion layer in a DRAM or a substitute semiconductor memory.

As a candidate semiconductor memory that substitutes for a DRAM, for example, an E2PROM (electrically erasable and programmable read-only memory), which is a non-volatile semiconductor memory, may be considered. However, an E2PROM is not suitable for the user like a DRAM because its writing speed is much lower than that of a DRAM. As an E2PROM needs a high voltage writing data, it does not meet the demand for lower-voltage operation/ reduction in power consumption. Moreover, since an E2PROM does not match SOI, it is not suitable for the user on an SOI substrate as a substitute for a DRAM.

As another candidate that substitutes for a DRAM, an SRAM (static random-access memory) that does not need refreshing if a power-supply voltage is applied thereon may be considered. Since an SRAM is a memory that is formed only by transistors and does not use a capacitor element, unlike in a DRAM, the data holding time is not decided by a leakage current. Therefore, an SRAM matches an SOI substrate well and enables high-speed operation similarly to a DRAM. However, an SRAM uses no capacitors but needs six transistors for per bit. Therefore, an SRAM cannot realize high integration equivalent to that of a DRAM and cannot meet the demand for reduction in size, weight and thickness.

As still another candidate that substitutes for a DRAM, an FRAM (ferroelectric random-access memory) may be considered. A typical FRAM is a memory that has been made non-volatile so that it needs no refreshing and can hold data even when a power-supply voltage is not applied thereon, by changing a paraelectric material used for a capacitor element of a DRAM to a ferroelectric material having a hysteresis characteristic.

The hysteresis characteristic of an FRAM is generated by the relation between an electric field (voltage) and polarization. For example, even if the voltages of both ends of the ferroelectric material (capacitor element) is made 0 V (short circuit) after a voltage of writing is applied, residual dielectric polarization due to the hysteresis characteristic exists in the ferroelectric material and therefore a current corresponding to the writing content can be outputted by applying a predetermined pulse field at the time of reading. Moreover, under typical conditions, the data holding time based on the hysteresis characteristic (residual dielectric polarization) of the ferroelectric material used for an FRAM is ten years or longer.

Therefore, as an FRAM instead of a DRAM is used on an SOI substrate, it is considered that a semiconductor memory that meets the demand for lower-voltage operation and reduction in power consumption as well as the demand for reduction in size, weight and thickness can be provided.

It is known that heat treatment in the mixed gas of N2 and deteriorates the hysteresis characteristic compared with the initial state, even if recovery heat treatment is later performed in oxygen. (For example, see J. Im, et al.4, "Studies of hydrogen-induced degradation processes in SrBi2Ta209 ferroelectric film-based capacitors," Applied Physics Letters, American Institute of Physics, 22 Feb. 1999, Vol.74, No.8, pp.1162–1164.) In a process of manufacturing a semiconductor such as an FRAM, exposure to a hydrogen atmosphere is possible at every step. Therefore, at every step of the process of manufacturing a semiconductor using a ferroelectric material, the hysteresis characteristic of the ferroelectric material often deteriorates in a hydrogen atmosphere.

However, the value of residual dielectric polarization of the ferroelectric material used for the capacitor element of the above-described conventional FRAM is varied by even a small difference in composition of the ferroelectric material and a difference in the thin film forming process. Therefore, there is a problem that it is difficult to stably manufacture the ferroelectric material having a value of residual dielectric polarization that realizes a data holding time of ten years or longer.

In short, with the capacitor element of the conventional FRAM, it is difficult to manufacture a thin film of a ferroelectric material that maintains the quantity of residual dielectric polarization in an electroless state for many years, and a thin film of a ferroelectric material having the quantity of residual dielectric polarization reduced to less than a predetermined threshold value for reading out written contents after the lapse of a predetermined time tends to be manufactured.

SUMMARY OF THE INVENTION

In order to solve the conventional problems as described above, it is an object of the present invention to provide a semiconductor memory having an FRAM instead of a DRAM formed on an SOI substrate, using a ferroelectric material such that the quantity of residual dielectric polarization in an electroless state is not maintained for many years.

A semiconductor memory according to the present invention comprises a memory cell including at least one transistor element and at least one capacitor element, and for the capacitor element, a material is used such that the quantity of residual dielectric polarization in an electroless state in a hysteresis characteristic is not reduced to less than a predetermined threshold value until after the lapse of the time of a refreshing cycle including at least plural clocks. The semiconductor memory has a sense amplifier for detecting a bit line output current value due to residual dielectric polarization, the sense amplifier amplifying the bit line output current value to refresh the quantity of residual dielectric polarization of the capacitor element when the quantity of polarization based on the detected value is equal to or larger than a threshold value, and the sense amplifier not amplifying the bit line output current value when the quantity of polarization based on the detected value is less than the threshold value.

As described above, in the present invention, even when a ferroelectric material of imperfect or poor quality such that the quantity of residual dielectric polarization in an electroless state is not maintained for many years is used for an FRAM, the memory contents can be held by refreshing. Since data can be read out from an FRAM even when the voltages of a word line and a plate line are caused to be the same electric potential, a semiconductor memory having an FRAM instead of a DRAM formed on an SOI substrate can be provided. This semiconductor memory does not have the problem of increase in junction leakage current and can meet all the demands for reduction in size, weight and thickness, lower-voltage operation, reduction in power consumption, and high-speed operation. Higher integration, reduction in size, weight and thickness, lower-voltage operation, and reduction in power consumption can be realized.

Moreover, in the present invention, even when an ideal ferroelectric material for an FRAM is used, a paraelectric material may be combined and connected in series to intentionally make the memory non-volatile and the memory contents can be held by refreshing. Therefore, a semiconductor memory can be provided in which an FRAM similar to the above-described FRAM instead of a DRAM is formed on an SOI substrate.

Figure 1:
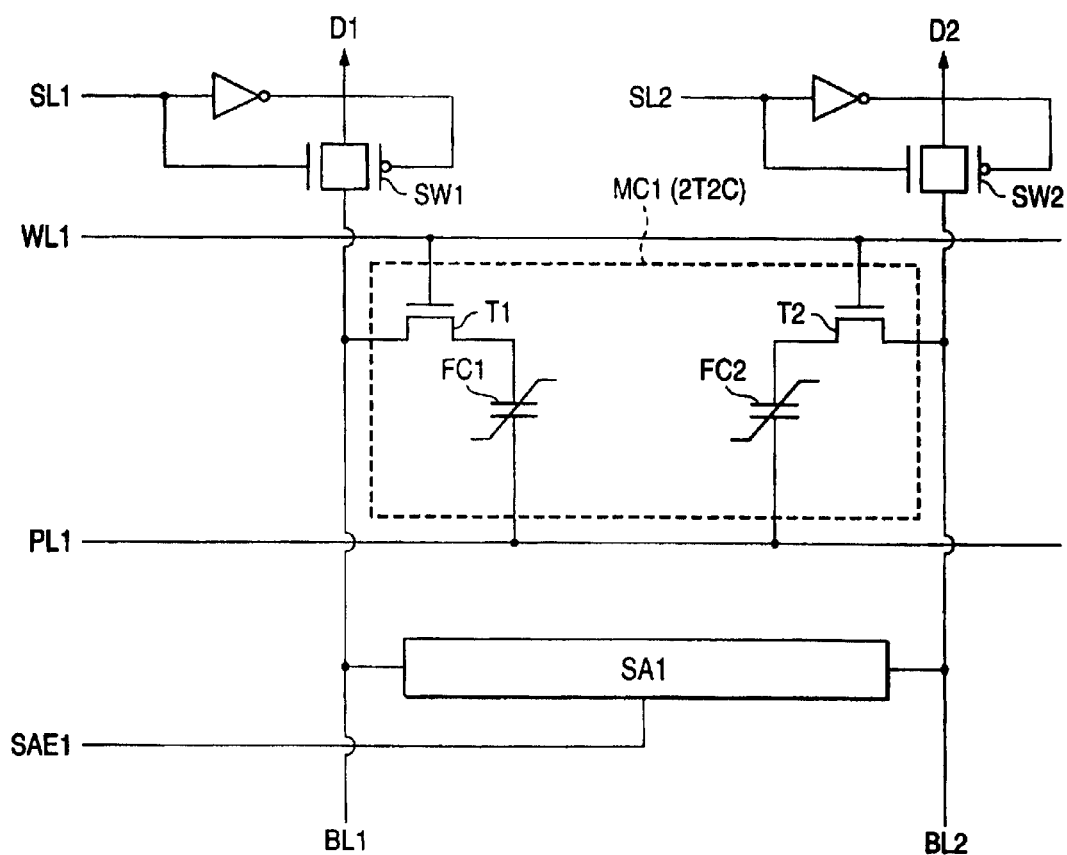
FIG. 1 is a block diagram showing a part of the structure of a semiconductor memory according to Embodiment 1 of the present invention.

DETAILED DESCRIPTION OF THE PREFERRED EMBODIMENTS.

The present invention will now be described on the basis of embodiments shown in the drawings.

Embodiment 1

In this embodiment, since it is difficult to stably manufacture an ideal ferroelectric material having a value of residual dielectric polarization that realizes a data holding time of ten years or longer, as described above, the inventor has considered formation of an FRAM on an SOI substrate using a ferroelectric material of imperfect or poor quality in order to realize easy manufacture and reduce the manufacturing cost. In this course, the inventor has noted that even a ferroelectric material of imperfect or poor quality can hold the quantity of residual dielectric polarization to such an extent that discrimination between "1" or "0" can be made, for example, in about two seconds, and therefore a certain value of residual dielectric polarization can be held until after the lapse of the time of a refreshing cycle including at least plural clocks. As a result, the inventor has found that even an FRAM using a ferroelectric material of imperfect or poor quality can be formed on an SOI substrate and can be practically used by refreshing similar to a DRAM.

However, unlike a DRAM, the refreshing cycle in the case of the FRAM using a ferroelectric material of imperfect or poor quality is not decided by a junction leakage current but decided by the holding time of the quantity of residual dielectric polarization. Therefore, the frequency of the refreshing cycle can be much less than in a DRAM, and the power for refreshing can be reduced, compared with a DRAM.

FIG. 1 is a block diagram showing a part of the structure of a semiconductor memory according to Embodiment 1 of the present invention.

FIG. 1 shows the structure around one memory cell MC1 in the semiconductor memory (memory cell array) of Embodiment 1. The memory cell MC1 is a 2T2C-type FRAM having, in this single memory cell, two transistors T1, T2 and two capacitor elements FC1, FC2 using a ferroelectric material, and storing one-bit information. The memory cell MC1 is arranged at the intersections of a word line WL1 and bit lines BL1, BL2.

The ferroelectric material used for the capacitor elements FC1, FC2 is a material such that the quantity of residual dielectric polarization in an electroless state in a hysteresis characteristic is not reduced to less than a predetermined threshold value until after the lapse of a refreshing cycle including at least plural clocks.

The selector gates of the transistors T1, T2 are connected to the word line WL1. The drains of the transistors T1, T2 are connected to the bit lines BL1, BL2, respectively. The sources of the transistors T1, T2 are connected to the poles on one side of the ferroelectric capacitor elements PC1, PC2, respectively. The other poles of the ferroelectric capacitors FC1, FC2 are connected to a plate line PL1.

A switching element SW1 is provided on the bit line BL1, and its continuity and discontinuity are switched by a signal on a switch line SL1. Also a switching element SW2 is provided on the bit line BL2, and its continuity and discontinuity are switched by a signal on a switch line SL2. As data D1, D2 are inputted to the bit lines BL1, BL2 in the state of continuity, data writing is carried out. The data D1 and D2 are inputted in such a manner that their logical levels are constantly opposite to each other. Therefore, the two sets of transistor elements and capacitor elements of the memory cell MC1 are at constantly opposite logical levels.

Between the bit lines BL1 and BL2, a sense amplifier SA1 for detecting and amplifying the current on each bit line is provided to connect the bit lines BL1, BL2 with each other. The sense amplifier SA1 is ON/OFF-controlled by a H/L signal on a sense amplifier earth line SAE1.

The sense amplifier SA1 detects the output current value of the bit lines BL1, BL2 based on residual dielectric polarization. When the detected value or the quantity of polarization based on the detected value is equal to or larger than a predetermined threshold value, the sense amplifier SA1 amplifies the bit line output current value to refresh the quantity of residual dielectric polarization of the capacitor elements. When the quantity of polarization based on the detected value is less than the threshold value, the sense amplifier does not amplify the bit line output current value. Since the data D1 and D2 written to the bit lines BL1, BL2 are at constantly opposite logical levels, as described above, refreshing of one of the bit lines BL1, BL2 is not performed when refreshing of the other is performed.

The memory cell MC1, the sense amplifier SA1 and the like of this embodiment are formed on an SOI (silicon-on-insulator) substrate in order to meet the demands for reduction in size, weight and thickness, lower-voltage operation, reduction in power consumption, and high-speed operation. However, if lower-voltage operation, reduction in power consumption and the like are not necessary, the memory cell MC1 and the like may be provided on a bulk Si substrate as in the conventional technique FIG. 2 shows a hysteresis characteristic (field-polarization characteristic) of the ferroelectric material used for the capacitor elements FC1, FC2 of FIG. 1.

For example, if an electric field is applied at the time of writing and the quantity of polarization increases to +A, residual dielectric polarization of a quantity of +Pr1 remains in the capacitor elements even though the applied electric field is reduced to 0. Similarly, if an electric field is applied at the time of writing and the quantity of polarization decreases (increases) to −B, residual dielectric polarization of a quantity of −Pr2 remains in the capacitor elements even though the applied electric field is reduced to 0.

In this embodiment, since refreshing is performed, a typical ferroelectric material having a value of residual dielectric polarization that realizes a data holding time of ten years or longer need not be used, and it suffices to use a ferroelectric material such that the quantity of residual dielectric polarization in an electroless state in a hysteresis characteristic is not reduced to less than a predetermined threshold until after the lapse of the time of a refreshing cycle including at least a plural clocks. In short, a ferroelectric material such that the quantity of residual dielectric polarization is reduced to less than the predetermined threshold value after the lapse of a predetermined time equal to or longer than the refreshing cycle including plural clocks may be used.

Figure 2:
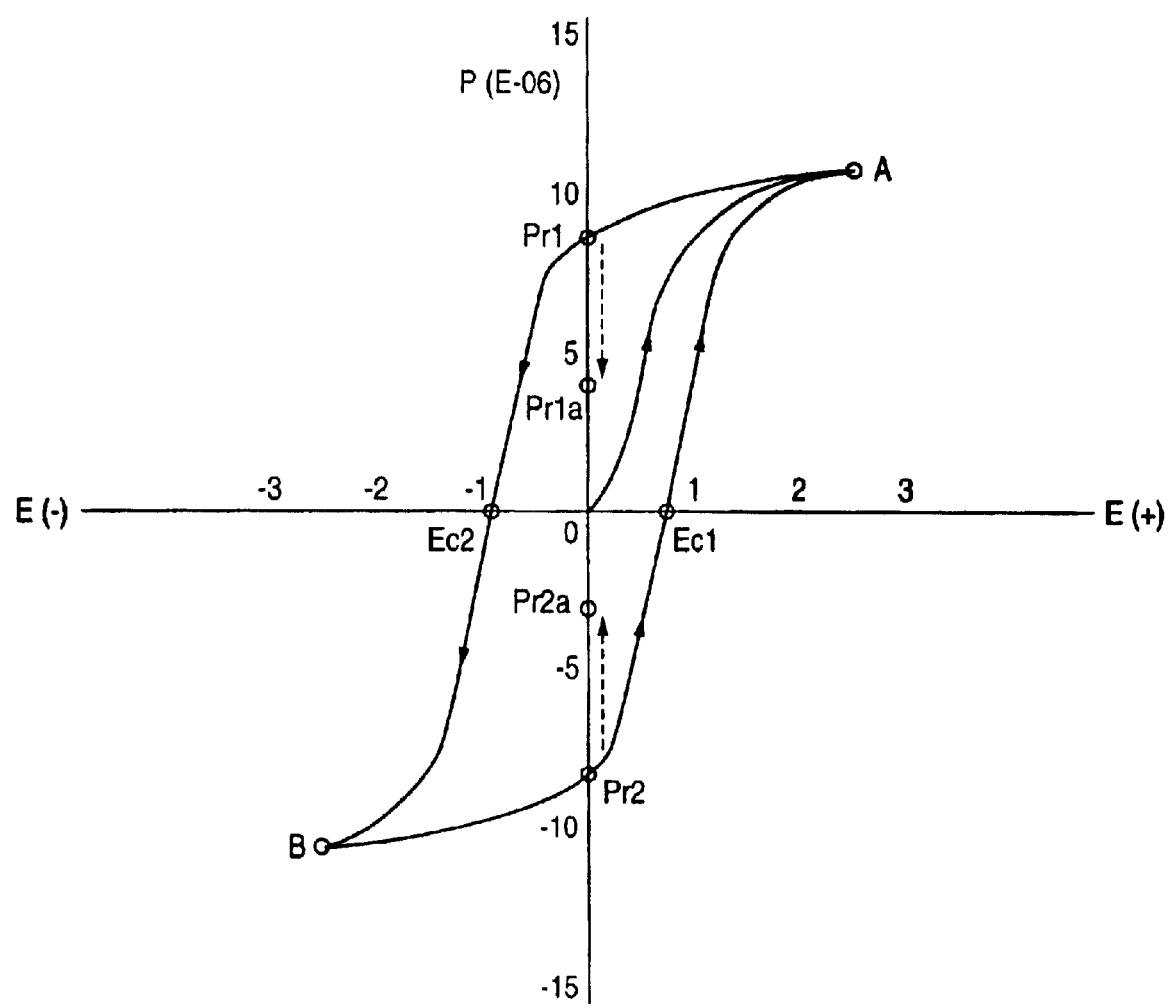
FIG. 2 shows a hysteresis characteristic (field-polarization characteristic) of a ferroelectric material used for a capacitor element of FIG. 1.

In the case of FIG. 2, the capacitor elements may be manufactured using a ferroelectric material having such a poor hysteresis characteristic that the value of the quantity of residual dielectric polarization Pr1 or Pr2 is lowered to Pr1a or Pr2a after two seconds or so from data writing. Generally, when manufacturing a capacitor element using a ferroelectric material, residual dielectric polarization can be maintained for approximately two seconds, even if a material of a poor hysteresis characteristic is used.

Therefore, in this embodiment, it is not necessary to form thin films of the capacitor elements using a ferroelectric material having a value of residual dielectric polarization that realizes a data holding time of ten years or longer, which cannot be manufactured easily and stably. Thus, it is possible to stably manufacture the capacitor elements (ferroelectric material).

The operation of the semiconductor memory shown in FIG. 1 will now be described.

Figure 3:
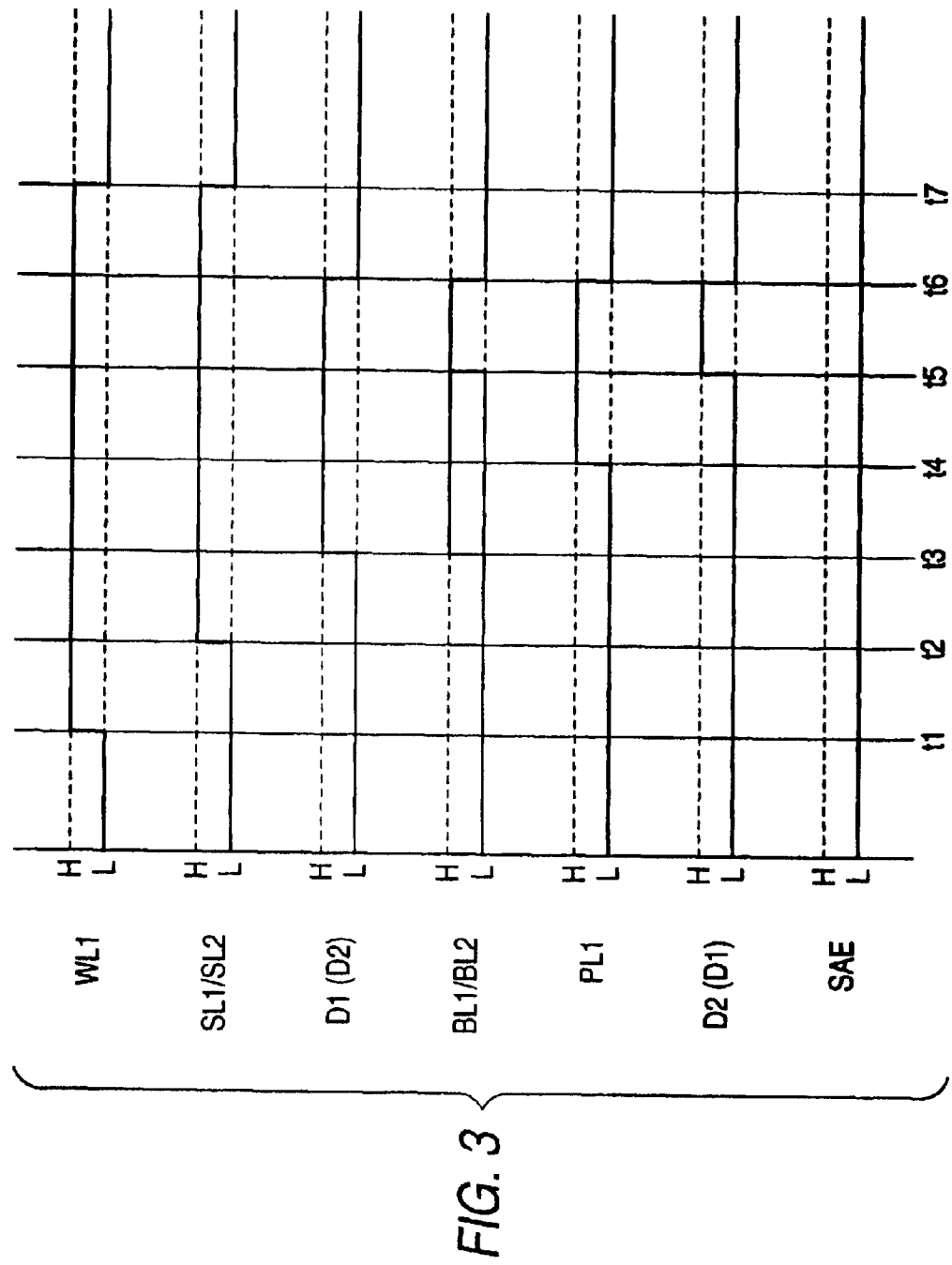
FIG. 3 is a timing chart at the time of writing to the semiconductor memory shown in FIG. 1.

FIG. 3 is a timing chart at the time of writing to the semiconductor memory shown in FIG. 1. In FIG. 3, t1 to t7 represents the timing of each clock in writing.

(1-1) At the timing of t1, the word line WL1 is switched to a high voltage (H) and the transistor elements T1, T2 of the memory cell MC1 are turned on, thus setting the state of continuity.

(1-2) At the timing of t2, signals on the switch lines SL1, SL2 turn on the switching elements SW1, SW2 on the bit lines BL1, BL2, thus setting the state of continuity.

(1-3) A desired high voltage (H) is applied to the bit lines BL1, BL2 and the plate line PL1 at desired timing, thus writing data. For example, to the bit line BL1, data D1 is applied at the timing of t3 to t6 and a high voltage (H) is applied at the timing of t3 to t5. To the bit line BL2, a high voltage (H) and data D2 are applied at the timing of t5 and t6. To the plate line PL1, a high voltage (H) is applied at the timing of t4 to t6. Thus, data writing is performed.

In this embodiment, the memory cell MC1 includes the two sets of transistor elements T1, T2 and capacitor elements FC1, FC2 that are at constantly opposite logical levels. Therefore, as the state of continuity of the bit line BL1 and the bit line BL2 is controlled at the time of writing, writing is performed to the capacitor element of one set while writing is not performed to the capacitor element of the other set.

(1-4) At the timing of t6, all of the bit lines BL1, BL2 and the plate line PL1 are switched to a low voltage (L).

(1-5) At the timing of t7, the word line WL1 is switched to a low voltage (L) and the transistor elements T1, T2 of the memory cell MC1 are turned off, thus setting the state of discontinuity.

Figure 4:
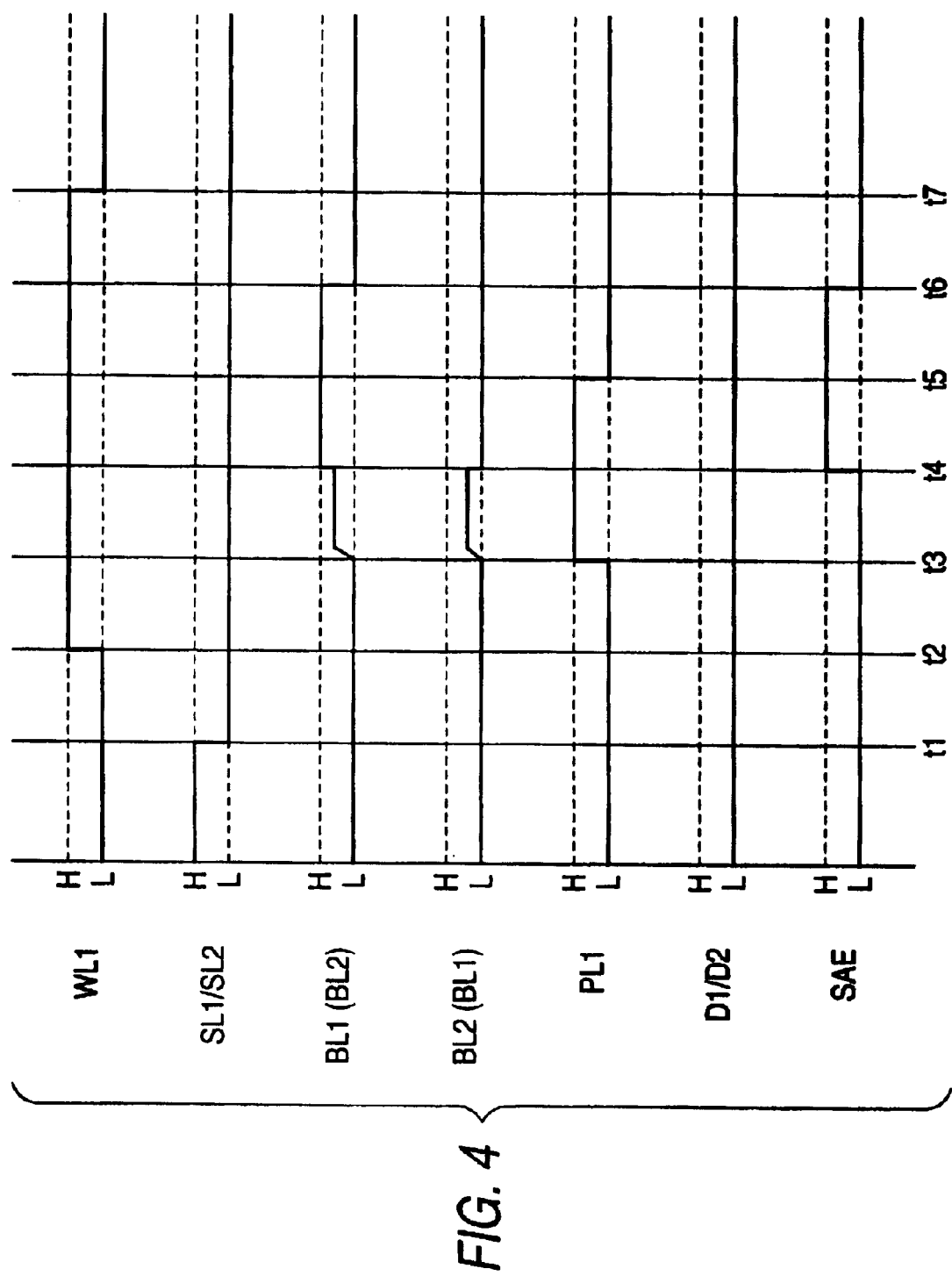
FIG. 4 is a timing chart at the time of reading from or refreshing of the semiconductor memory shown in FIG. 1.

FIG. 4 is a timing chart at the time of reading from or refreshing of the semiconductor memory shown in FIG. 1. In FIG. 4, t1 to t7 represent the timing of each clock in reading.

(1–1a) At the timing of t1, signals on the switch lines SL1, SL2 turn off the switching elements SW1, SW2 on the bit lines BL1, BL2, thus setting the state of discontinuity.

(1–2a) At the timing of t2, the word line WL1 is switched to a high voltage (H), setting the transistor elements T1, T2 of the memory cell MC1 in the state of continuity.

(1–3a) At the timing of t3, the sense amplifier SA1 detects the output of the bit lines BL1, BL2 and judges whether or not the detected value is equal to or higher than a predetermined threshold value. If the detected value is equal to or higher than the threshold value, a refreshed high voltage (H) is outputted at the timing of t4. If the detected value is less than the threshold value, a low voltage (L) is outputted at the timing of t4. Thus, data reading is performed.

In this embodiment, the memory cell MC1 includes the two sets of transistor elements T1, T2 and capacitor elements FC1, FC2 that are at constantly opposite logical levels. Therefore, at the time of reading, the outputs of both sets of the capacitor element on the bit lines BL1 and the bit line BL2 are judged in comparison with the threshold value, and the difference between the two is read out as the storage content.

In this case of this embodiment, data can be read out on the basis of residual dielectric polarization even when both the word lines WL1 and the plate line PL1 are at a high voltage (H). However, in the case of a conventional DRAM, data cannot be read out when the word line WL1 and the plate line PL1 are at the same voltage.

(1–4a) At the timing of t3 to t5, a high voltage (H) is applied to the plate line PL1, and data reading is performed at the timing of t4 and t5.

(1–5a) At the timing of t6, all the bit lines BL1, BL2 and the plate line PL1 are switched to a low voltage (L).

(1–6a) At the timing of t7, the word line WL1 is switched to a low voltage (L) and the transistor elements T1, T2 of the memory cell MC1 are turned off, thus setting the state of discontinuity.

With the semiconductor memory of this embodiment, since it is possible to read data even when the voltages of the word line WL1 and the plate line PL1 are at the same potential as described above, the time of the refreshing cycle is not affected by a leakage current from a junction and the refreshing cycle can be decided in accordance with the data holding (maintaining) time based on residual dielectric polarization.

In this manner, with the semiconductor memory of this embodiment, the refreshing cycle can be decided in accordance with the time period of maintaining the quantity of residual dielectric polarization even when a ferroelectric material such that the quantity of residual dielectric polarization in an electroless state cannot be maintained for many years is used, and therefore no problem arises. Moreover, since data can be read out even when the voltages of the word line W11 and the plate line PL1 are at the same potential, the problem of increase in junction leakage current does not occur. Therefore, a FRAM that meets all the demands for reduction in size, weight and thickness, lower-voltage operation, reduction in power consumption and high-speed operation can be formed on an SOI substrate.

Embodiment 2

In the above-described Embodiment 1, the memory cell MC1 is a 2T2C-type FRAM that has, in this single memory cell, two transistors T1, T2 and two capacitor elements FC1, FC2 using a ferroelectric material, and stores one-bit information. This invention is also applicable to the case of a 1T1C-type FRAM in which one memory cell has one transistor and one ferroelectric capacitor element therein and stores one-bit information. This case will now be described.

Figure 5:
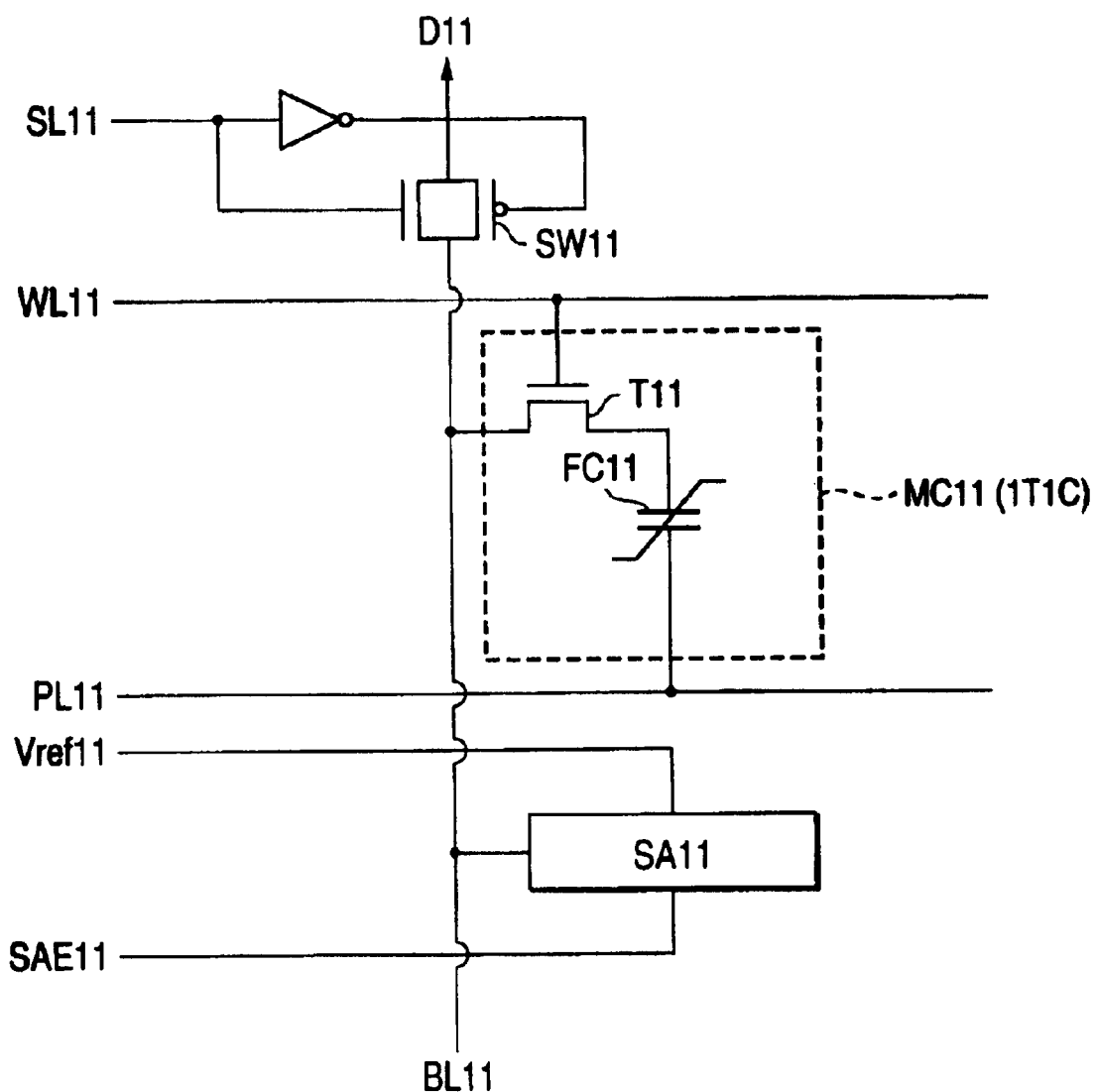
FIG. 5 is a block diagram showing a part of the structure of a semiconductor memory according to Embodiment 2 of the present invention.

FIG. 5 is a block diagram showing a part of the structure of a semiconductor memory according to Embodiment 2 of the present invention.

In FIG. 5, the number of transistors and capacitors are reduced, that is, one set of transistor and capacitor (transistor element T11 and capacitor element FC11) is provided, compared with the memory cell MC1 of Embodiment 1. Therefore, one bit line BL11, one switching line SL11 for the bit line, and one switching element SW11 are provided. Also single data D11 is provided. Only one input from the bit line BL11 is supplied to a sense amplifier SA11 and comparison of two inputs as in Embodiment 1 cannot be performed at the time of reading. Therefore, a reference voltage Vref11 is inputted to the sense amplifier SA11. The other parts of the structure are similar to those of Embodiment 1, though these parts are denoted by different symbols/numerals in order to discriminate these parts from those of Embodiment 1.

The operation of the semiconductor memory shown in FIG. 5 will now be described.

Figure 6:
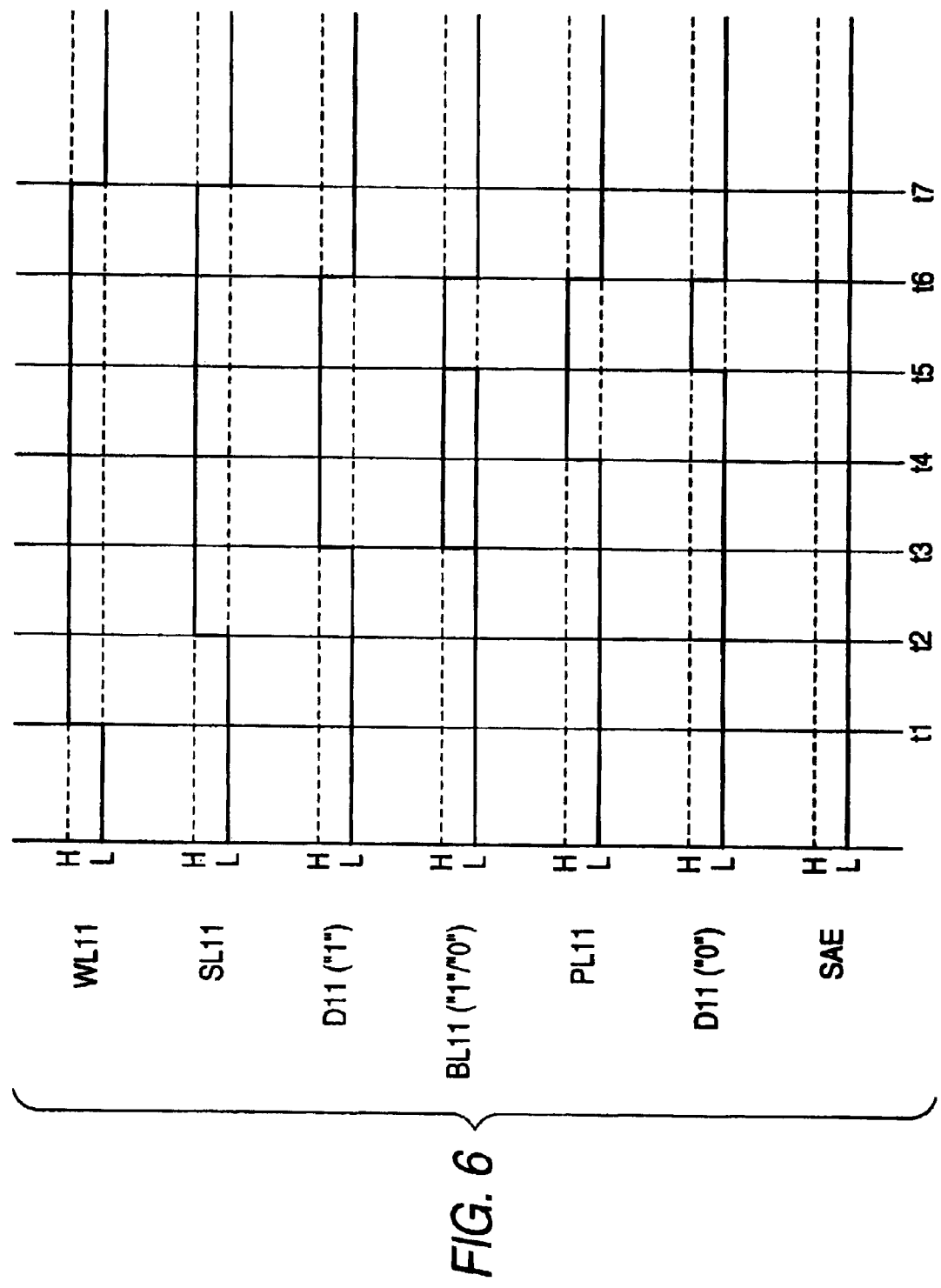
FIG. 6 is a timing chart at the time of writing to the semiconductor memory shown in FIG. 5.

FIG. 6 is a timing chart at the time of writing to the semiconductor memory shown in FIG. 5. In FIG. 6, t1 to t7 represent the timing of each clock at the time of writing.

(2–1) At the timing of t1, the word line WL11 is switched to a high voltage (H) and the transistor element T11 of the memory cell MC11 is turned on, thus setting the state of continuity.

(2–2) At the timing of t2, a signal on the switch line SL11 turns on the switching element SW11 on the bit line BL11, thus setting the state of continuity.

(2–3) A desired high voltage (H) is applied to the bit line BL11 and the plate line PC1 at desired timing, thus writing data. For example, in the case of writing data of "1", to the bit line BL11, data D11 ("1") is applied at the timing of t3 to t6 and a high voltage (H) is applied at the timing of t3 to t5. In the case of writing data of "0", to the bit line BL11, a high voltage (H) and data D11 ("0") are applied at the timing of t5 and t6. To the plate line PL11, a high voltage (H) is applied at the timing of t4 to t6. Thus, data writing is performed.

(2–4) At the timing of t6, both the bit line BL11 and the plate line PL11 are switched to a low voltage (L).

(2–5) At the timing of t7, the word line WL11 is switched to a low voltage (L) and the transistor element T11 of the memory cell MC11 is turned off, thus setting the state of discontinuity.

Figure 7:
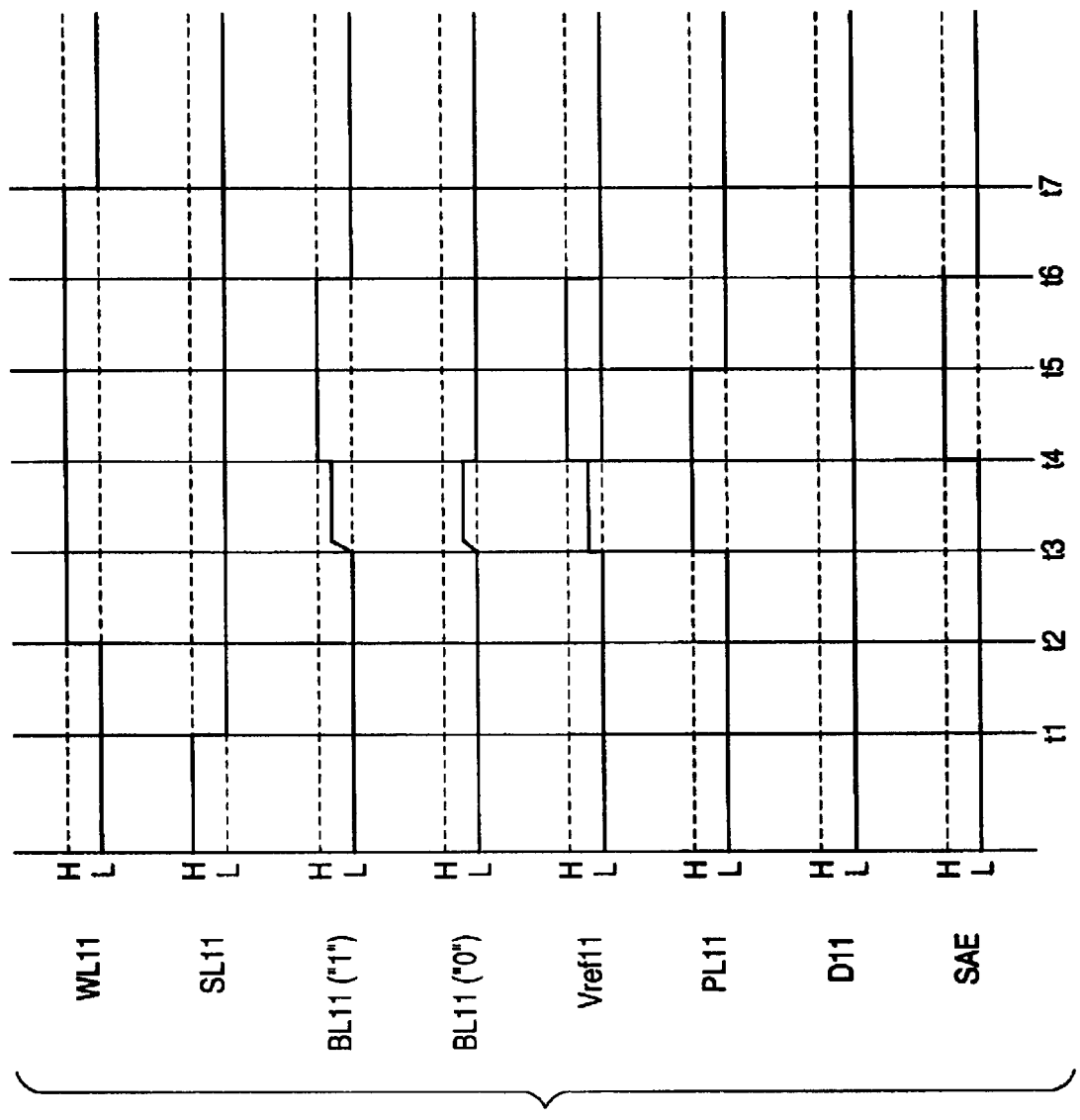
FIG. 7 is a timing chart at the time of reading from or refreshing of the semiconductor memory shown in FIG. 5.

FIG. 7 is a timing chart at the time of reading from or refreshing of the semiconductor memory shown in FIG. 5. In FIG. 7, t1 to t7 represent the timing of each clock in reading.

(2–1a) At the timing of t1, a signal on the switch line SL11 turns off the switching element SW11 on the bit lines BL11, thus setting the state of discontinuity.

(2–2a) At the timing of t2, the word line WL11 is switched to a high voltage (H), setting the transistor element T11 of the memory cell MC11 in the state of continuity.

(2–3a) At the timing of t3, the sense amplifier SA11 detects the output of the bit line BL11 and the reference voltage Vref11 and judges whether or not the detected value is equal to or higher than a predetermined threshold value (reference voltage Vref11) If the detected value is equal to or higher than the threshold value (data of "1"), a refreshed high voltage (H) is outputted at the timing of t4. If the detected value is less than the threshold value (data of "0"), a low voltage (L) is outputted at the timing of t4. Thus, data reading is performed.

Also in this embodiment, it can be understood that data can be read out on the basis of residual dielectric polarization even when both the word lines WL11 and the plate line PL11 are at a high voltage (H).

(2-4a) At the timing of t3 to t5, a high voltage (H) is applied to the plate line PL11, and data reading is performed at the timing of t4 and t5.

(2-5a) At the timing of t6, both the bit line BL11 and the plate line PL11 are switched to a low voltage (L).

(2-6a) At the timing of t7, the word line WL11 is switched to a low voltage (L) and the transistor element T11 of the memory cell MC11 is turned off, thus setting the state of discontinuity.

Again, with the semiconductor memory of this embodiment using a 1T1C-type FRAM, since it is possible to read data even when the voltages of the word line WL11 and the plate line PL11 are at the same potential as described above, the time of the refreshing cycle is not affected by a leakage current from a junction and the refreshing cycle can be decided in accordance with the data holding (maintaining) time based on residual dielectric polarization.

In this manner, with the semiconductor memory of this embodiment using a 1T1C-type FRAM, similarly to Embodiment 1, the refreshing cycle can be decided in accordance with the time period of maintaining the quantity of residual dielectric polarization even when a ferroelectric material such that the quantity of residual dielectric polarization in an electroless state cannot be maintained for many years is used, and therefore no problem arises. Moreover, since data can be read out even when the voltages of the word line WL11 and the plate line PL1 are at the same potential, the problem of increase in junction leakage current does not occur. Therefore, a FRAM that meets all the demands for reduction in size, weight and thickness, lower-voltage operation, reduction in power consumption and high-speed operation can be formed on an SOI substrate.

Moreover, in Embodiment 2, since a 1T1C-type FRAM is used, it is possible to realize higher integration than in Embodiment 1 where a 2T2C-type FRAM is used. This is more advantageous for reduction in size, weight and thickness, lower-voltage operation, and reduction in power consumption.

Embodiment 3

In the above-described Embodiments 1 and 2, a ferroelectric material of imperfect or poor quality is used as a single material of the capacitor element in the memory cell of the FRAM, and the FRAM is formed on the SOI substrate. In the case of a non-volatile memory using an ideal ferroelectric material having residual dielectric polarization that realizes a data holding time of ten years or longer, no refreshing is necessary and therefore it cannot be applied to Embodiments 1 and 2.

The advantages of a volatile memory such as a DRAM will now be considered. For example, since unnecessary data is not left when the power is turned off, the volatile memory can be easily used repeatedly and its storage capacity can be made smaller than that of a non-volatile memory such as a hard disk. Considering the problem of failure to erase data in the hard disks in the recent buying and selling of used information processing devices, the volatile memory is also advantageous when data should not be left in the memory for the purpose of security. That is, even when an ideal ferroelectric material of an FRAM can be provided, volatility of the FRAM is demanded in some cases. Hereinafter, the case of intentionally making an FRAM volatile and holding the memory contents by refreshing, even when an ideal ferroelectric material is used for the FRAM, will be described.

Figure 8:
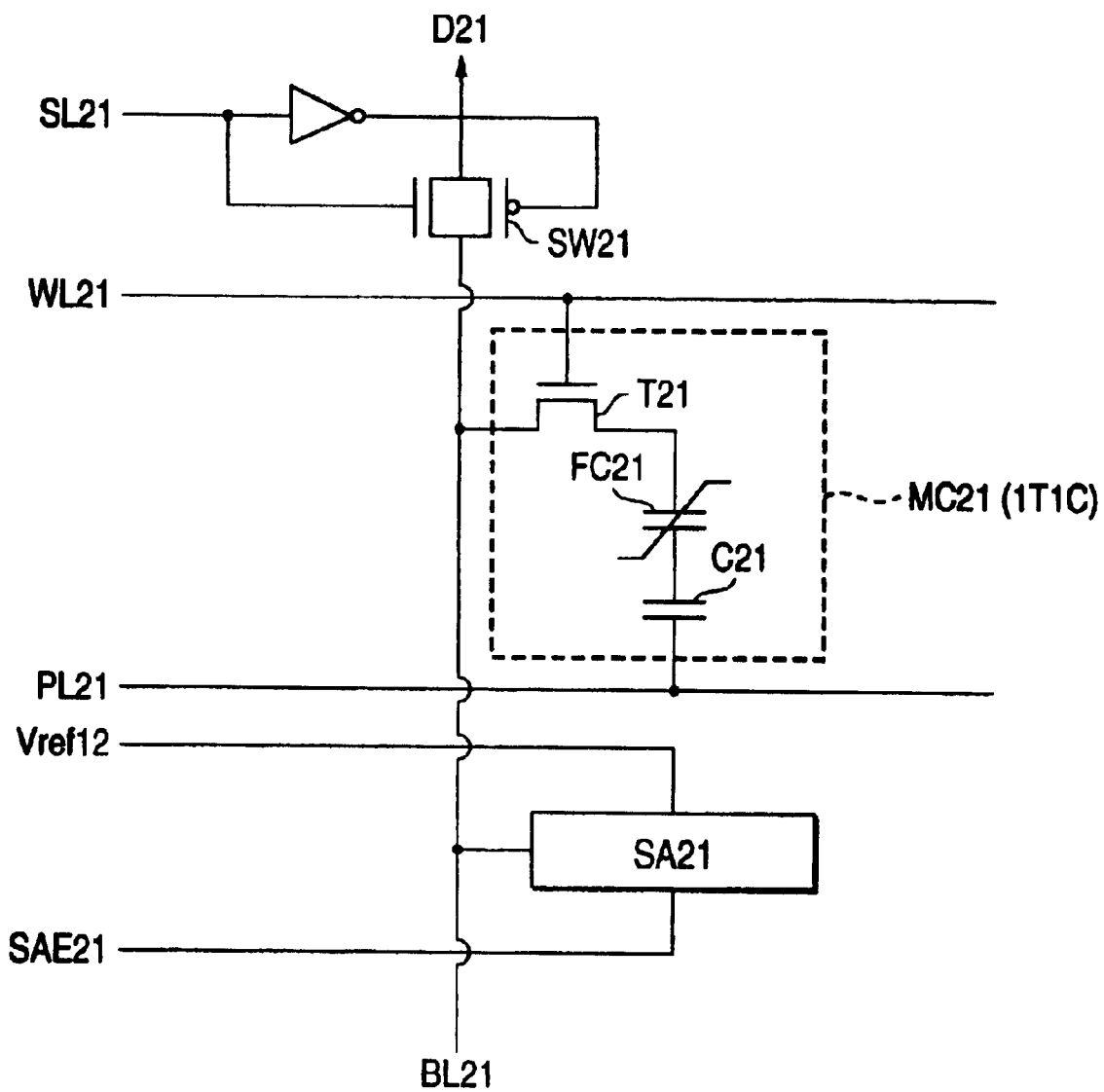
FIG. 8 is a block diagram showing a part of the structure of a semiconductor memory according to Embodiment 3 of the present invention.

FIG. 8 is a block diagram showing a part of the structure of semiconductor memory according to Embodiment 3 of the present invention.

The structure shown in FIG. 8 differs from that of the memory cell MC11 of Embodiment 2 in that a capacitor element C21 of a paraelectric material is provided in series with a capacitor element FC21 of a ferroelectric material. The other parts of the structure are similar to those of Embodiment 2, though these parts are denoted by different symbols/numerals in order to discriminate these parts from those of Embodiment 2.

Specifically, in this embodiment, a ferroelectric material and a paraelectric material are combined and connected in series as the capacitor elements in the memory cell, thus acquiring an operation (effect) similar to the effect of using a ferroelectric material of imperfect or poor quality as a single material of the capacitor element in the memory cell of the FRAM of Embodiment 2. This principle will be described hereinafter.

When the capacitor element FC21 of a ferroelectric material and the capacitor element C21 of a paraelectric material are combined and connected in series as the capacitor elements in the memory cell as shown in FIG. 8, stable residual dielectric polarization is generated at the capacitor element FC21 of a ferroelectric material in a short-circuit state after data writing, for example, after the timing t7 of FIG. 6. However, as electric charges charged in the capacitor element C21 of a paraelectric material are discharged, an electric field (opposite field) in the opposite direction to that of the residual dielectric polarization is applied to the capacitor element FC21. Therefore, the quantity of residual dielectric polarization in the capacitor element FC21 is reduced.

The polarization holding time in the case the capacitor element of a ferroelectric material and the capacitor element of a paraelectric material are combined and connected in series can be changed by adjustment at the time of manufacturing the ferroelectric material and the paraelectric material and it is approximately a few minutes at most. However, a refreshing cycle that is sufficiently longer than at least the refreshing cycle of a DRAM can be realized.

As described above, in this embodiment, even when an ideal ferroelectric material is used for the FRAM, the FRAM can be intentionally made volatile by combining and connecting a paraelectric material in series with the ferroelectric material, and the memory contents can be held by refreshing. Therefore, an effect similar to that of Embodiment 2 can be acquired. Specifically, since data can be read even when the voltages of a word line WL21 and a plate line PL21 are at the same potential, the problem of increase in junction leakage current does not occur. An FRAM that meets all the demands for reduction in size, weight and thickness, lower-voltage operation, reduction in power consumption and high-speed operation can be formed on an SOI substrate. Higher integration than in Embodiment 1 is possible, and reduction in size, weight and thickness, lower-voltage operation and reduction in power consumption provide more advantages.

In the above-described embodiments, a ferroelectric material having a hysteresis characteristic is used for the capacitor element (s) of the FRAM. However, this invention is not limited to this material, and other materials that have a hysteresis characteristic and form polarization may be used.

In the above-described embodiments, hybrid mounting of the FRAM and other devices on the SOI substrate is assumed. However, this invention is not limited to this structure. For example, the FRAM of this invention may be singly formed on the SOI substrate. Alternatively, the FRAM of this invention may be formed on a bulk Si substrate.

What is claimed is:

1. A semiconductor memory comprising a memory cell including at least one transistor element and at least one capacitor element, wherein for the capacitor element, a material is used such that the quantity of residual dielectric polarization in an electroless state in a hysteresis characteristic is not reduced to less than a predetermined threshold value until after the lapse of the time of a refreshing cycle including at least plural clocks, and the semiconductor memory has a sense amplifier for detecting a bit line output current value due to the residual dielectric polarization, the sense amplifier amplifying the bit line output current value to refresh the quantity of residual dielectric polarization of the capacitor element when the quantity of polarization based on the detected value is equal to or larger than a threshold value, and the sense amplifier not amplifying the bit line output current value when the quantity of polarization based on the detected value is less than the threshold value.

2. The semiconductor memory as claimed in claim 1, wherein the memory cell includes two sets of transistor elements and capacitor elements that at constantly opposite logical levels, and the threshold value of the sense amplifier is so set as to refresh the capacitor element of one set while not refreshing the capacitor element of the other set.

3. The semiconductor memory as claimed in claim 1, wherein the memory cell includes one set of transistor element and capacitor element, and the threshold value of the sense amplifier is so set as to perform refreshing with respect to the quantity of polarization based on the detected value after one clock in the case where 1 is written to the memory cell, and not to perform refreshing with respect to the quantity of polarization based on the detected value after one clock in the case where 0 is written to the memory cell.

4. The semiconductor memory as claimed in claim 1, wherein a ferroelectric material such that the quantity of reduction in residual dielectric polarization after a predetermined time is equal to or more than the predetermined value is used for the capacitor element.

5. The semiconductor memory as claimed in claim 4, wherein the capacitor element includes the ferroelectric material and a paraelectric material having no hysteresis characteristic that are connected in series.

6. The semiconductor memory as claimed in claim 1, wherein the memory cell and the sense amplifier are formed on an SOI (silicon-on-insulator) substrate.

7. A writing method for a semiconductor memory comprising a memory cell including a capacitor element and a transistor element, the capacitor element using a ferroelectric material such that the quantity of residual dielectric polarization in an electroless state in a hysteresis characteristic is not reduced to less than a predetermined threshold value until after the lapse of the time of a refreshing cycle including at least plural clocks, the semiconductor memory having a sense amplifier for performing refreshing when a detected value of a bit line output is equal to or larger than a threshold value, the method comprising:

switching a word line to a high voltage and turning on the transistor element of the memory cell, thus setting a state of continuity;

turning on a switching element on a bit line, thus setting a state of continuity;

applying a desired high voltage to the bit line and a plate line at desired timing, thus performing writing;

switching all the bit line and the plate line to a low voltage; and switching the word line to a low voltage and turning off the transistor element of the memory cell, thus setting a state of discontinuity.

8. The writing method for a semiconductor memory as claimed in claim 7, wherein when the memory cell includes two sets of transistor elements and capacitor elements that at constantly opposite logical levels, at the time of writing, writing to the capacitor element of one set is performed while writing to the capacitor element of the other set is not performed.

9. A reading method for a semiconductor memory comprising a memory cell including a capacitor element and a transistor element, the capacitor element using a ferroelectric material such that the quantity of residual dielectric polarization in an electroless state in a hysteresis characteristic is not reduced to less than a predetermined threshold value until after the lapse of the time of a refreshing cycle including at least plural clocks, the semiconductor memory having a sense amplifier for performing refreshing when a detected value of a bit line output is equal to or larger than a threshold value, the method comprising:

turning off a switching element on a bit line, thus setting a state of discontinuity;

switching a word line to a high voltage and turning on the transistor element of the memory cell, thus setting a state of continuity;

detecting an output of the bit line by the sense amplifier, judging whether or not the detected value is equal to or larger than the predetermined threshold value, outputting a refreshed high voltage if the detected value is equal to or larger than the threshold value, and out putting a low voltage if the detected value is less than the threshold value, thus performing reading;

applying a high voltage to a plate line, thus reading out data;

switching all the bit plate and the plate line to a low voltage; and switching the word line to a low voltage and turning off the transistor element of the memory cell, thus setting a state of discontinuity.

10. The reading method for a semiconductor memory as claimed in claim 9, wherein when the memory cell includes two sets of transistor elements and capacitor elements that at constantly opposite logical levels, at the time of reading, outputs of the capacitor elements of the two sets are judged in comparison with the threshold value and a difference between the two is read out as a storage content.

11. The reading method for a semiconductor memory as claimed in claim 9, wherein at the time of reading, the word line and the plate line are at a high voltage.

* * * * *